(12) United States Patent
Farley et al.

(10) Patent No.: US 10,581,450 B1
(45) Date of Patent: Mar. 3, 2020

(54) EMBEDDED VARIABLE GAIN AMPLIFIER IN A CURRENT STEERING DIGITAL-TO-ANALOG CONVERTER

(71) Applicant: Xilinx, Inc., San Jose, CA (US)

(72) Inventors: Brendan Farley, Donabate (IE); Bob W. Verbruggen, Dublin (IE); Christophe Erdmann, Dublin (IE); Roberto Pelliconi, Imola (IT)

(73) Assignee: XILINX, INC., San Jose, CA (US)

( * ) Notice: Subject to any disclaimer, the term of this patent is extended or adjusted under 35 U.S.C. 154(b) by 0 days.

(21) Appl. No.: 16/249,230

(22) Filed: Jan. 16, 2019

(51) Int. Cl.
*H03M 1/66* (2006.01)
*H03G 3/30* (2006.01)
*H03F 3/45* (2006.01)

(52) U.S. Cl.
CPC .......... *H03M 1/66* (2013.01); *H03F 3/45183* (2013.01); *H03G 3/3042* (2013.01)

(58) Field of Classification Search
CPC ..... H03M 1/66; H03F 3/45183; H03G 3/3042
USPC .................................. 341/125–155
See application file for complete search history.

(56) References Cited

U.S. PATENT DOCUMENTS

| | | |
|---|---|---|
| 5,241,310 A | 8/1993 | Tiemann |
| 5,594,612 A | 1/1997 | Henrion |
| 6,420,988 B1 | 7/2002 | Munehiro et al. |
| 6,720,898 B1 | 4/2004 | Ostrem |
| 7,414,555 B1* | 8/2008 | Nathawad ........... H03M 1/1215 341/122 |
| 7,528,754 B1* | 5/2009 | Bakkaloglu ........... H03M 3/504 341/136 |
| 8,860,597 B2* | 10/2014 | Sienko ................ H03M 1/0863 341/140 |
| 2005/0180501 A1* | 8/2005 | Clark ................... H04N 19/105 375/240.01 |
| 2007/0188219 A1* | 8/2007 | Segarra .................. G01R 19/32 330/2 |
| 2012/0286984 A1* | 11/2012 | Schimper ............ H03M 1/0881 341/144 |
| 2013/0043943 A1* | 2/2013 | Chen ........................ H03G 1/04 330/97 |
| 2015/0048961 A1* | 2/2015 | Schafferer ............. H03M 1/747 341/145 |

(Continued)

*Primary Examiner* — Lam T Mai
(74) *Attorney, Agent, or Firm* — Craige Thompson

(57) ABSTRACT

Apparatus and associated methods relating to a digital-to-analog converter (DAC) include a programmable resistance network coupled between a voltage supply node $V_{DD}$ and a switch cell circuit to provide a predetermined resistance in response to the $V_{DD}$ and current $I_S$ of the switch cell circuit. In an illustrative example, the DAC may include a switch cell circuit comprising one or more switch cells connected in parallel. Each switch cell may include a differential gain circuit having a first branch coupled to a second branch at an input of a current source. The programmable resistance may include a variable resistance configured to adjust a voltage (Vbias) supplied to the switch cell circuit in response to a control signal. By introducing the programmable resistance network, predetermined bias and/or gain values may be dynamically adjusted with a constant board-level power supply $V_{DD}$.

20 Claims, 6 Drawing Sheets

(56) References Cited

U.S. PATENT DOCUMENTS

2015/0236746 A1* 8/2015 Scheinkerman ......... H04B 1/40
375/219

* cited by examiner

| $I_S$ | variable resistance | $V_{DD}$ | Control signals VRPS |
|---|---|---|---|
| 10 mA | 0 ohm | 3V | close switch 1,2,3,4 |
| 15 mA | 5 ohm | 3V | Open switch 1, close switch 2,3,4 |
| 20 mA | 10 ohm | 3V | Open switch 2, close switch 1,3,4 |
| 25 mA | 15 ohm | 3V | ... |
| 30 mA | 20 ohm | 3V | ... |

| $I_S$ | Differential resistance | $V_{DD}$ | Control signals VDRPS |
|---|---|---|---|
| 10 mA | 5 ohm | 3 V | Close switch 1,2,3,4 |
| 15 mA | 10 ohm | 3 V | Open switch 1,2, close switch 3,4 |
| 20 mA | 15 ohm | 3 V | Open switch 2,3, close switch 1,4 |
| 25 mA | 20 ohm | 3 V | ... |
| 30 mA | 25 ohm | 3 V | ... |

EMBEDDED VARIABLE GAIN AMPLIFIER IN A CURRENT STEERING DIGITAL-TO-ANALOG CONVERTER

TECHNICAL FIELD

Various embodiments relate generally to digital-to-analog converters (DAC).

BACKGROUND

Data represents information that has useful value. Data can take the form of stored information. Data storage can be in analog form. Data storage can also be in digital form.

Data can also be in digital format communicated between two nodes. When data is communicated, for example, it can be received and interpreted as a function of time. Some systems that receive communicated digitally-formatted data are based on a clock that determines when a voltage signal is sampled to decide whether a symbol in a data stream is, for example, a one or a zero. Sometimes, a data is received without knowing its specific phase information. Phase alignments are performed before launching data or receiving data to ensure data accuracy and data integrity. An analog-to-digital converter (ADC) converts analog signals into digital signals. A digital-to-analog converter converts digital signals into analog signals.

SUMMARY

Apparatus and associated methods relating to a digital-to-analog converter (DAC) include a programmable resistance network coupled between a voltage supply node $V_{DD}$ and a switch cell circuit to provide a predetermined resistance in response to the $V_{DD}$ and current $I_S$ of the switch cell circuit. In an illustrative example, the DAC may include a switch cell circuit comprising one or more switch cells connected in parallel. Each switch cell may include a differential gain circuit having a first branch coupled to a second branch at an input of a current source. The programmable resistance may include a variable resistance configured to adjust a voltage (Vbias) supplied to the switch cell circuit in response to a control signal. By introducing the programmable resistance network, predetermined bias and/or gain values may be dynamically adjusted with a constant board-level power supply $V_{DD}$.

Various embodiments may achieve one or more advantages. For example, some embodiments may allow gain levels to be set independently from the common mode output level. In some embodiments, transistors used in the current steering switch cell circuit may be adaptively biased according to circuit operating conditions, which may advantageously reduce reliability problems. Integrated circuits with various embodiments may be flexibly applied to a wide range of circuit conditions and/or configurations. In some embodiments that incorporate a capacitance may advantageously improve high frequency performance.

In some embodiments, by introducing the programmable resistance network, a controllable common mode voltage may be dynamically adjusted and may be independent of the board-level supply $V_{DD}$. As a result, a differential gain level may be set independently, and the board-level power supply $V_{DD}$ may remain constant for different current values of the current source. In some embodiments, by introducing the programmable resistance network, the reliability problems of transistors in the DAC may be advantageously reduced.

In one exemplary aspect, a voltage biasing circuit includes a switch cell circuit. The switch cell circuit includes at least one switch cell, each of the at least one switch cells includes a differential gain circuit having a first branch coupled to a second branch at an input of a current source. The first branch and the second branch are configured to combine their respective currents to supply a current amplitude of $I_{DAC}$ to the current source in response to a differential control signal. The voltage biasing circuit also includes a first differential resistance coupled to supply current from a bias node to the first branch of each of the at least one switch cells. A second differential resistance is also coupled to supply current from the bias node to the second branch of each of the at least one switch cells. The voltage biasing circuit also includes a programmable resistance coupled between a voltage supply node $V_{DD}$ and the bias node. The programmable resistance includes a variable resistance that is configured to adjust a voltage $V_{bias}$ at the bias node to one of a predetermined set of values in response to a variable resistance programming signal (VRPS).

In some embodiments, the voltage biasing circuit may also include a control circuit configured to generate the VRPS in response to automatically determined circuit parameters. The circuit parameters may include the amplitude of $I_{DAC}$. The circuit parameters may also include the resistance values of the first differential resistance and the second differential resistance. In some embodiments, the control circuit may be configured to generate the VRPS in response to a lookup table storing one or more predetermined settings for the VRPS.

In some embodiments, the voltage biasing circuit may also include a control circuit configured to generate the VRPS in response to predetermined gain specification for a Digital-to-Analog Converter (DAC). The voltage biasing circuit may also include a capacitance arranged in a parallel configuration with at least a portion of the programmable resistance. In some embodiments, the programmable resistance may include a network of resistive paths configured to be selectively controlled in response to the VRPS. The network of resistive paths may include one or more p-channel FETs.

In some embodiments, the voltage biasing circuit may also include a first programmable differential resistance coupled in parallel with the first differential resistance. The first programmable differential resistance may include a first variable resistance configured to adjust a differential gain of the first branch to a first predetermined gain value in response to a first variable differential resistance programming signal (VDRPS). In some embodiments, the voltage biasing circuit may also include a second programmable differential resistance coupled in parallel with the second differential resistance. The second programmable differential resistance may include a second variable resistance configured to adjust the differential gain of the second branch to a second predetermined gain value in response to a second VDRPS. In some embodiments, the voltage biasing circuit may include a plurality of the at least one switch cell connected in parallel. The plurality of the at least one switch cell connected in parallel may include switch cells between 1 and 128.

In another exemplary aspect, a method of configuring a digital-to-analog converter includes combining, with a switch cell circuit, respective currents from a first branch and a second branch to supply a current amplitude of $I_{DAC}$ to a current source in response to a differential control signal. The switch cell circuit includes at least one switch cell and each of the at least one switch cells includes a differential gain circuit having the first branch coupled to the second branch at an input of the current source. The method also includes supplying current from a bias node to the first branch of each of the at least one switch cells through a first differential resistance. The method also includes supplying current from the bias node to the second branch of each of the at least one switch cells through a second differential resistance and adjusting a voltage $V_{bias}$ at the bias node to one of a predetermined set of values in response to a VRPS through a programmable resistance coupled between a voltage supply node $V_{DD}$ and the bias node. The programmable resistance includes a variable resistance configured to adjust the voltage $V_{bias}$ at the bias node.

In some embodiments, the VRPS may be generated in response to automatically determined circuit parameters. The circuit parameters may include the amplitude of $I_{DAC}$. The circuit parameters may also include the resistance values of the differential resistance network. In some embodiments, the first differential resistance may be programmable. In some embodiments, the second differential resistance may be programmable. In some embodiments, the switch cell circuit may include a plurality of the at least one switch cells connected in parallel.

The details of various embodiments are set forth in the accompanying drawings and the description below. Other features and advantages will be apparent from the description and drawings, and from the claims.

BRIEF DESCRIPTION OF THE DRAWINGS

Like reference symbols in the various drawings indicate like elements.

DETAILED DESCRIPTION

To aid understanding, this document is organized as follows. First, an exemplary platform (e.g., FPGA) suitable to perform digital-to-analog conversion is briefly introduced with reference to FIG. 1. Second, with reference to FIGS. 2-4, the discussion turns to introduce how exemplary circuits may make an embedded variable gain amplifier in a current steering digital-to-analog converter (DAC) have a controllable common mode voltage that is independent of the external board-level supply $V_{DD}$. Finally, with reference to FIG. 5 and FIG. 6, the discussion discloses an exemplary control circuit and an exemplary method that may be used to configure the DAC.

By introducing a programmable resistance network, a controllable common mode voltage may be dynamically adjusted and may be independent of a board-level supply $V_{DD}$. As a result, a differential gain level may be set independently, and the board-level power supply $V_{DD}$ may remain constant for different current values of the current source. In some embodiments, by introducing the programmable resistance network, the reliability problems of transistors in the DAC may be advantageously reduced.

Figure 1:
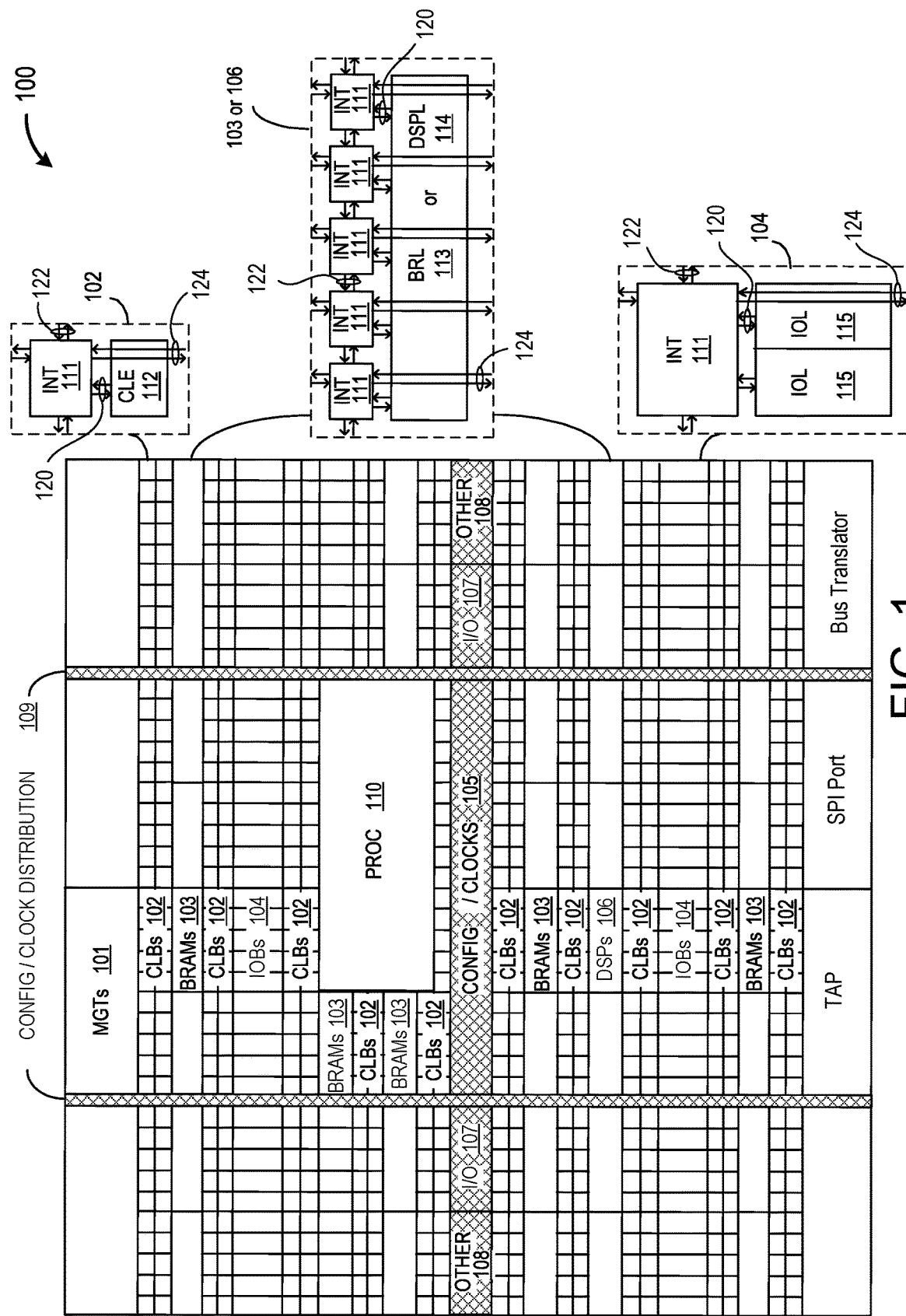
FIG. 1 depicts an exemplary programmable integrated circuit (IC) on which the disclosed circuits and processes may be implemented.

FIG. 1 depicts an exemplary programmable integrated circuit (IC) on which the disclosed circuits and processes may be implemented. A programmable IC 100 includes a Field Programmable Gate Array (FPGA) logic. The programmable IC 100 may be implemented with various programmable resources and may be referred to as a System on Chip (SOC). Various examples of FPGA logic may include several diverse types of programmable logic blocks in an array.

For example, FIG. 1 illustrates a programmable IC 100 that includes a large number of different programmable tiles including multi-gigabit transceivers (MGTs) 101, configurable logic blocks (CLBs) 102, blocks of random access memory (BRAMs) 103, input/output blocks (IOBs) 104, configuration and clocking logic (CONFIG/CLOCKS) 105, digital signal processing blocks (DSPs) 106, specialized input/output blocks (I/O) 107 (e.g., clock ports), and other programmable logic 108 (e.g., digital clock managers, analog-to-digital converters, system monitoring logic). The programmable IC 100 includes dedicated processor blocks (PROC) 110. The programmable IC 100 may include internal and external reconfiguration ports (not shown).

In various examples, a serializer/deserializer may be implemented using the MGTs 101. The MGTs 101 may include various data serializers and deserializers. Data serializers may include various multiplexer implementations. Data deserializers may include various demultiplexer implementations.

In some examples of FPGA logic, each programmable tile includes a programmable interconnect element (INT) 111 having standardized inter-connections 124 to and from a corresponding interconnect element in each adjacent tile. Therefore, the programmable interconnect elements taken together implement the programmable interconnect structure for the illustrated FPGA logic. The programmable interconnect element INT 111 includes the intra-connections 120 to and from the programmable logic element within the same tile, as shown by the examples included in FIG. 1. The programmable interconnect element INT 111 includes the inter-INT-connections 122 to and from the programmable interconnect element INT 111 within the same tile, as shown by the examples included in FIG. 1.

For example, a CLB 102 may include a configurable logic element (CLE) 112 that may be programmed to implement user logic, plus a single programmable interconnect element INT 111. A BRAM 103 may include a BRAM logic element (BRL) 113 and one or more programmable interconnect elements. In some examples, the number of interconnect elements included in a tile may depend on the height of the tile. In the pictured implementation, a BRAM tile has the same height as five CLBs, but other numbers (e.g., four) may also be used. A DSP tile 106 may include a DSP logic element (DSPL) 114 and one or more programmable interconnect elements. An IOB 104 may include, for example, two instances of an input/output logic element (IOL) 115 and one instance of the programmable interconnect element INT 111. The actual I/O bond pads connected, for example, to the I/O logic element 115, may be manufactured using metal layered above the various illustrated logic blocks, and may not be confined to the area of the input/output logic element 115.

In the pictured implementation, a columnar area near the center of the die (shown shaded in FIG. 1) is used for configuration, clock, and other control logic. Horizontal areas 109 extending from the column distribute the clocks and configuration signals across the breadth of the programmable IC 100. Note that the references to "columnar" and "horizontal" areas are relative to viewing the drawing in a portrait orientation.

Some programmable ICs utilizing the architecture illustrated in FIG. 1 may include additional logic blocks that disrupt the regular columnar structure making up a large part of the programmable IC. The additional logic blocks may be programmable blocks and/or dedicated logic. For example, the processor block PROC 110 shown in FIG. 1 spans several columns of CLBs 102 and BRAMs 103.

FIG. 1 illustrates an exemplary programmable IC architecture. The numbers of logic blocks in a column, the relative widths of the columns, the number and order of columns, the types of logic blocks included in the columns, the relative sizes of the logic blocks, and the interconnect/logic implementations are provided purely as examples. For example, in an actual programmable IC, more than one adjacent column of CLBs 102 may be included wherever the CLBs 102 appear, to facilitate the efficient implementation of user logic.

At least one transceiver may be embedded in the FPGA to perform data transmitting and data receiving during communication. Digital-to-analog converters (DACs) are used to convert digital signals into analog signals. DACs are used in many applications, for example, communication systems. Digital-to-analog conversion is the process of converting digital codes into a continuous range of analog signal levels. Digital codes can be converted into analog voltages, analog currents or analog charge signals using a DAC.

Figure 2:
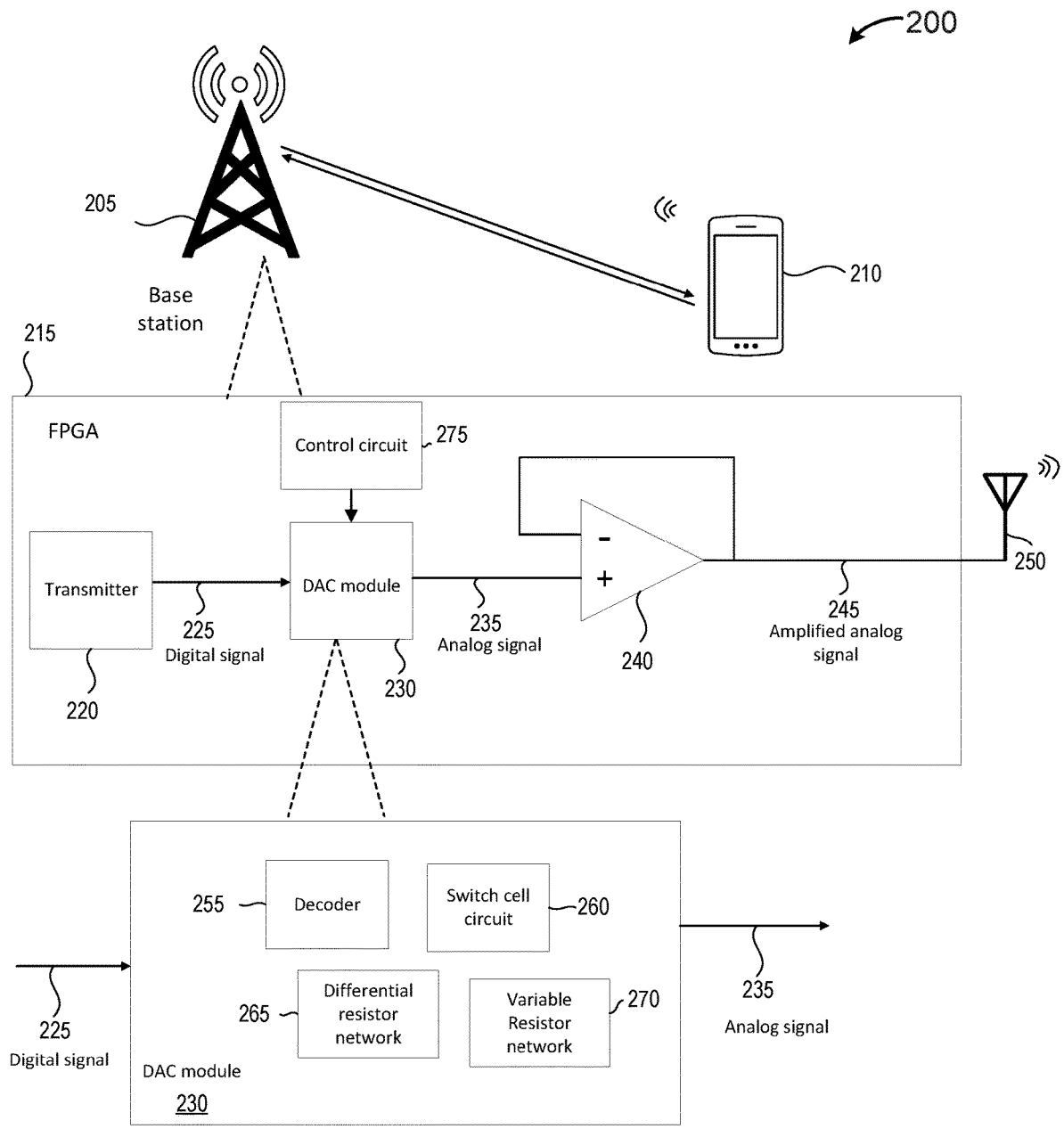
FIG. 2 depicts an exemplary digital-to-analog converter (DAC) implemented in a communication system.

FIG. 2 depicts an exemplary DAC implemented in a communication system. A communication system 200 includes a base station 205. The base station 205 may be used to transmit and receive data from some data communication devices. In this exemplary example, the base station 205 transmits a digital signal to a cell phone 210. The base station 205 includes an FPGA 215 to perform data communication from the base station 205 to the cell phone 210. The FPGA 215 includes a transmitter 220 transmitting a digital signal 225. The digital signal 225 is received by a DAC 230 and converted to an analog signal 235. The analog signal 235 is amplified by an amplifier 240 to form an amplified analog signal 245. The amplified analog signal 245 is transmitted to the cell phone 210 through an antenna device 250.

The DAC 230 includes a decoder 255. The decoder 255 may convert words in the digital signal 225 into a differential analog data signal. The DAC 230 also includes a switch cell circuit 260. The differential analog data signal may be amplified to a differential analog amplified signal through the switch cell circuit 260. The DAC 230 also includes a differential resistance network 265 that functions as termination resistances for the switch cell circuit 260. In radio applications, depending on how far the data is to be transmitted, the amplitude of the differential analog data signal may be changed. Therefore, the gain of the DAC 230 may be adjusted to fulfill the transmitting. To dynamically adjust the gain of the DAC 230, a variable resistance network 270 is designed to be embedded in the DAC 230. By changing a resistance of the variable resistance network 270, the gain of the DAC 230 may be adjusted dynamically.

The FPGA 215 includes a control circuit 275 that is configured to control the resistance of the variable resistance network 270. The control circuit may determine a bias requirement by detecting circuit parameters (e.g., current and power supply) and configuration information about load (e.g., specifications for downstream circuits). An example of a control circuit 275 is described in further detail with reference to FIG. 5.

Figure 3:
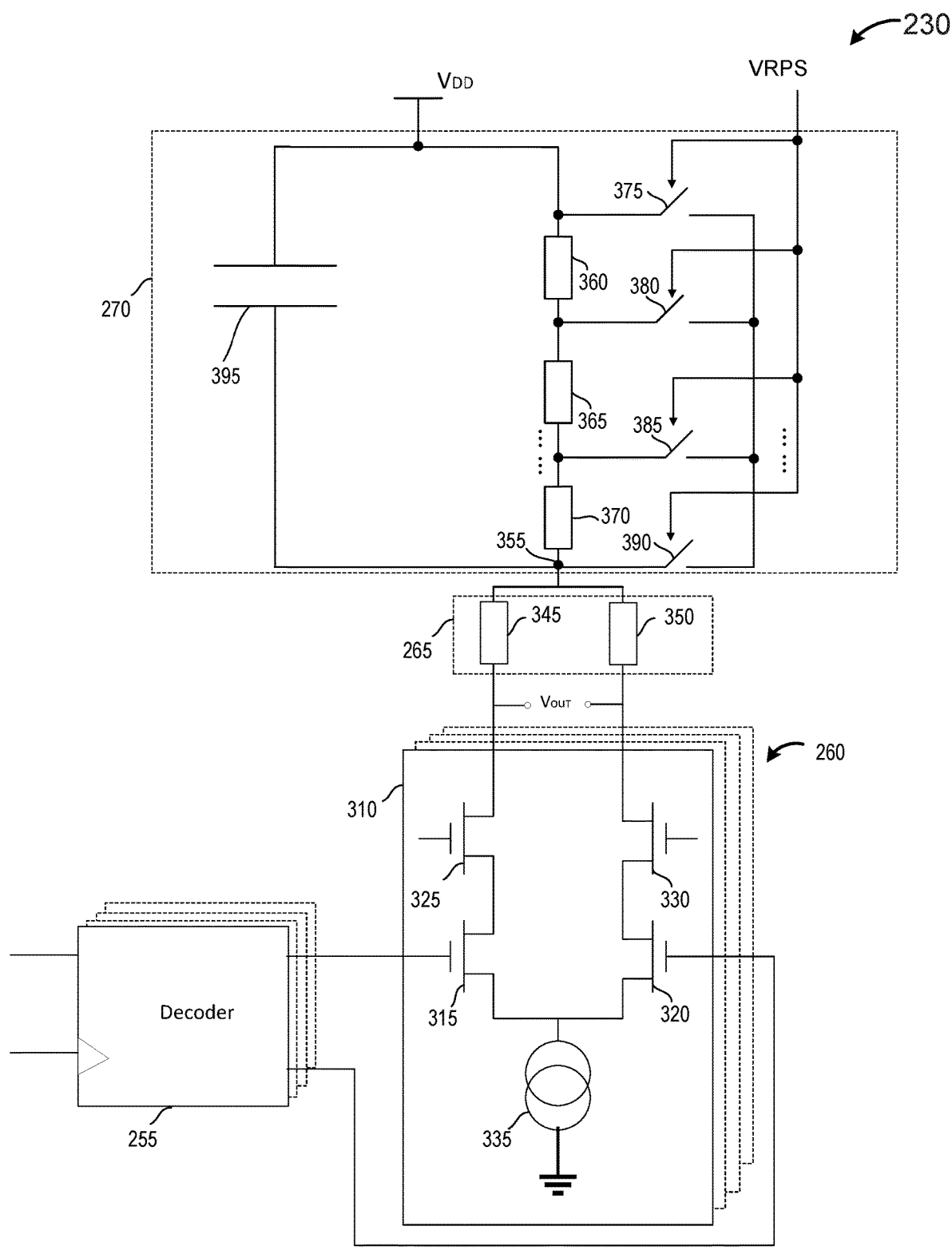
FIG. 3 depicts an exemplary variable gain amplifier embedded in the DAC.

FIG. 3 depicts an exemplary variable gain amplifier embedded in the DAC. The DAC 230 includes the decoder 255. The decoder 255 may convert words in the digital signal 225 into a differential analog data signal (e.g., a differential gate voltage). In some embodiments, the decoder 255 may be a binary-weighted decoder. In this depicted embodiment, the decoder 255 includes four slices of a decoding circuit.

The DAC 230 also includes the switch cell circuit 260. The differential analog data signal may be converted to a differential analog amplified signal through the switch cell circuit 260. In this depicted example, the switch cell circuit 260 includes a current steering switch cell circuit that operates while biased with a current value $I_S$. In this embodiments, the switch cell circuit 260 includes multiple slices (e.g., four slices) of switch cells 310. In some embodiments, the switch cell circuit 260 may include switch cells between 1 and 128 connected in parallel. For example, the switch cell circuit 260 may include 63 switch cells connected in parallel. When the switch cell circuit 260 is configured to have a current $I_S$, each of the switch cell in the switch cell circuit has a current amplitude of $I_{DAC}$. In various embodiments, $I_{DAC}$ may equal $I_S$/number of slices.

Each switch cell 310 includes a first pair of transistors (e.g., MOSFETs, BJTs). The first pair of transistors includes a first transistor 315 and a second transistor 320, having respective control terminals (e.g., gate terminals) on which the differential analog data signal (e.g., the differential gate voltage) is received. Respective drains of the first pair of transistors 315,320 are coupled to a second pair of transistors 325,330. The second pair of transistors, formed by a third transistor 325 and a fourth transistor 330, receives an enable signal on their respective gates. Respective sources of the first pair of transistors 315,320 are coupled to a current source 335. The other end of the current source 335 is connected to ground.

The DAC 230 also includes the differential resistance network 265. The differential resistance network 265 is coupled to the switch cell circuit 260 to provide a differential output voltage $V_{OUT}$. The differential resistance network 265 includes a first termination resistance 345 coupled to the drain of the third transistor 325. The differential resistance network 265 also includes a second termination resistance 350 coupled to the drain of the fourth transistor 330. The differential analog data signal may steer current in the switch cell circuit 260 either to the left-hand side through the left termination resistance 345 or to the right-hand side through the right termination resistance 350 when the differential analog data signal is 0 or 1. The differential analog data signal may also be adapted in a linear range in which the differential analog data signal may be amplified by a gain, which may be a function of, for example, the differential resistance network. In some embodiments, the transistors may be P-channel metal-oxide-semiconductor field effect transistors (PMOSFETs). In some embodiments, the transistors may be N-channel metal-oxide-semiconductor field effect transistors (NMOSFETs).

The DAC 230 also includes a variable resistance network 270. The variable resistance network 270 is a common mode variable resistance network that connects with the differential resistance network 265 through a bias node 355. The other end of the variable resistance network is coupled to an external board-level power supply $V_{DD}$.

The variable resistance network 270 can be programmed to obtain a desired voltage at the bias node 355. The variable resistance network 270 includes one or more resistances (e.g., resistances 360,365,370). The variable resistance network 270 also includes one or more switches (e.g., switch 375,380,385,390). Each switch of the one or more switches is controlled by a variable resistance programming signal (VRPS). The VRPS is generated by the control circuit 275. The resistances and switches in the variable resistance network 270 form multiple resistance paths with different resistances. By selecting different variable resistance programming signals, different resistance values may be obtained. Therefore, the voltage at the bias node 355 can be programmed to support, for example, a selected gain mode and/or a selected signal swing. In some embodiments, the switches may be digital switches. In some embodiments, the switches may be P-channel metal-oxide-semiconductor field effect transistors (PMOSFETs). In various implementations, the programmable variable resistance network 270 may advantageously permit the DAC 230 to operate with a widened range of supply voltages (e.g., $V_{DD}$) and bias converts. In addition, some embodiments may adaptively condition signals to match a range of load specifications.

The DAC 230 also includes a capacitor 395 that is connected with the variable resistance network 270 in parallel. The capacitor may advantageously improve the performance of the DAC 230 when the DAC 230 works in high frequency.

By introducing the variable resistance network 270, the voltage value at the bias node 355 can be dynamically adjusted. Therefore, the differential resistance network 265 and the switch cell circuit 260 can receive a controllable common mode voltage that is independent of the external board-level supply $V_{DD}$. As a result, a differential gain level can be set independently, and the board-level power supply $V_{DD}$ can remain constant for different current values of the current source 335. By introducing the variable resistance network 270, the reliability problems of those transistors 315,320,325,330 may be advantageously reduced. In some embodiments, the variable resistance network 270 may be arranged off chip. In some embodiments, the variable resistance network 270 may be formed or modified (e.g., trimmed) by hardware resources on, for example, the FPGA 215.

For example, the termination resistance 345, 350 may be about 50 ohms. The variable resistance network 270 may include a first resistor 360 that may be about 20 ohms, a second resistor 365 that may be about 30 ohms and a third resistor 370 that may be about 50 ohms. By controlling the switches in the variable resistance network, the variable resistance network may be configured to, for example, about 0 ohm, 20 ohms, 30 ohms, 50 ohms, 70 ohms, 80 ohms, or 100 ohms. The board-level power supply $V_{DD}$ may be configured to 4 V. The switch cell circuit having a four slice switch cell may work in a high gain mode that operates with a current value that is 40 mA when the variable resistance network has a resistance that is about 0 ohm. Each slice of the switch cell operates with a current 10 mA. To configure the DAC to work in a nominal gain mode that has a current 20 mA, the variable resistance network may be programmed to fulfill the configuration without changing the board-level power supply. In this example, the variable resistance network may need to be programmed to have a resistance that is 100 ohms.

Figure 4:
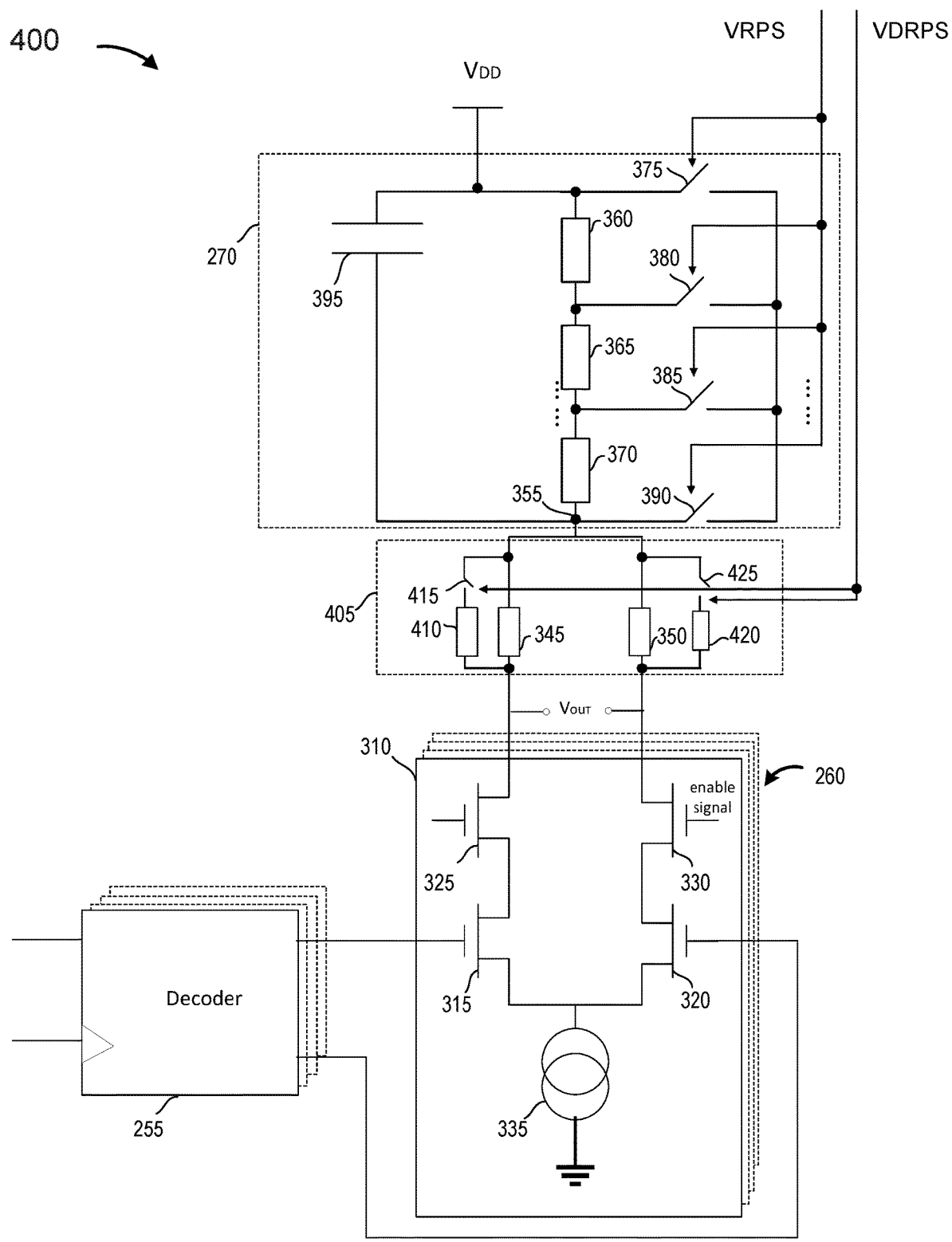
FIG. 4 depicts an exemplary variable gain amplifier embedded in a DAC.

FIG. 4 depicts an exemplary variable gain amplifier embedded in a DAC. In a DAC 400 in FIG. 4, the differential resistance network 265 shown in FIG. 3 has been replaced by a second differential resistance network 405. The second differential resistance network 405 is coupled to the switch cell circuit 260 operable to provide a differential output voltage $V_{OUT}$. The second differential resistance network 405 is programmable and under control of a variable differential resistance programming signal (VDRPS). The VDRPS may also be generated by the control circuit 275. By programming the second differential resistance network 405 and the variable resistance network 270, a differential gain level can be set independently, and the board-level power supply $V_{DD}$ can remain constant for different current values of the current source 335.

In this depicted example, the second differential resistance network 405 includes the first termination resistance 345 coupled to the drain of the third transistor 325 and the second termination resistance 350 coupled to the drain of the fourth transistor 330. The second differential resistance network 405 also includes a first programmable differential resistance path that is connected to the first termination resistance 345 in parallel. The first programmable differential resistance path includes a third termination resistance 410 connected with a first switch 415 in series. The first programmable differential resistance path may be enabled or disabled by controlling the first switch 415. The second differential resistance network 405 also includes a second programmable differential resistance path that is connected to the second termination resistance 350 in parallel. The second programmable differential resistance path includes a fourth termination resistance 420 connected with a second switch 425 in series. The second programmable differential resistance path may be enabled or disabled by controlling the second switch 425. The control circuit 275 may be used to generate variable differential resistance programming signals (VDRPS) to control the first programmable differential resistance path and the second programmable differential resistance path.

In some embodiments, the DAC may include the second differential resistance network 405 rather than both the variable resistance network 270 and the second differential resistance network 405, for example.

Figure 5:
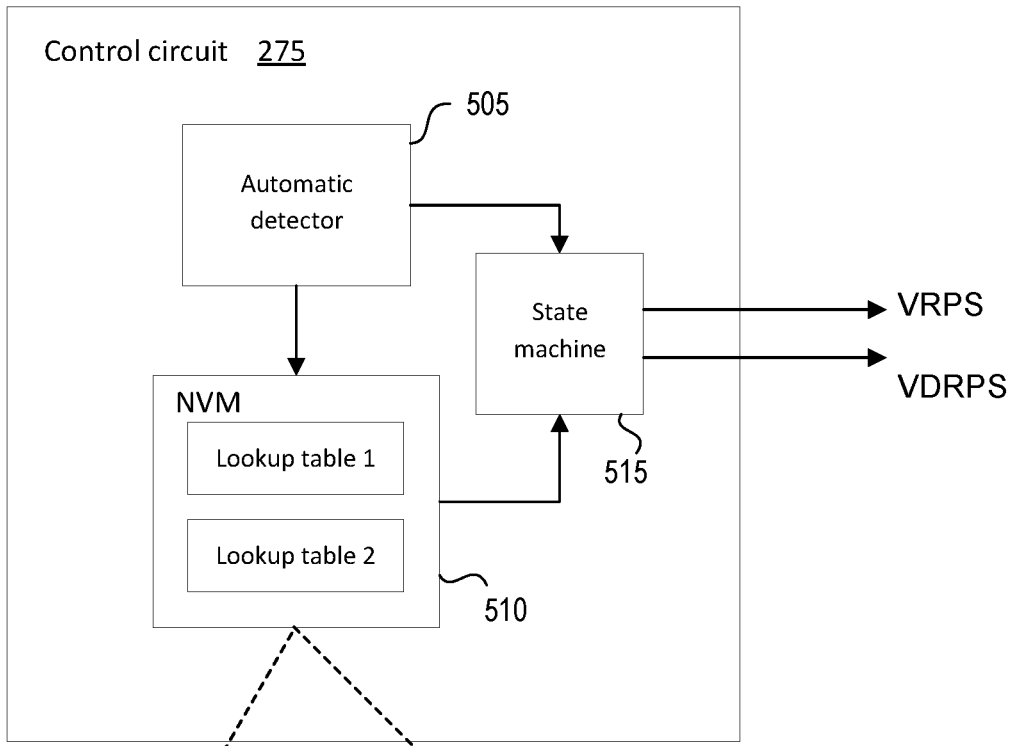
FIG. 5 depicts an exemplary control circuit used for the DAC.

FIG. 5 depicts an exemplary control circuit used for a DAC. With reference to FIG. 2, the control circuit 275 includes a detector 505. The detector 505 may automatically detect possible resistances of different resistance paths in the variable resistance network 270, resistances in the differential resistance network 265 and possible resistances in the second differential resistance network 405. In some embodiments, the variable resistance network 270 and/or the second differential resistance network 405 may be partially or entirely off-chip relative to a substrate die, and/or package that contains the DAC 230.

The control circuit 275 also includes a memory 510 (e.g., non-volatile memory). The memory 510 stores one or more lookup tables. The lookup tables contain setting information that specifies relationship among resistances, board-level voltages, current values of the current source, and control signals. In some embodiments, the DAC may include a differential resistance network (e.g., the differential resistance network 265) that have a stable resistance. The memory 510 may store one lookup table that contains all setting information. In some embodiments, the DAC may include a differential resistance network (e.g., the second differential resistance network 405) that may be programmable. The memory 510 may contain two lookup table. A first lookup table may be used to store setting information relating to the variable resistance network and a second lookup table may be used to store setting information relating to the differential resistance network.

The control circuit 275 also includes a state machine 515. The state machine 515 is configured to output a corresponding control signal (e.g., the VRPS, the VDRPS) to configure the switches in the variable resistance network 270 and/or the second differential resistance network 405 in response to a user predetermined board-level voltage $V_{DD}$ and current value of the current source 335. In some embodiments, the state machine 515 may only select the VRPS to configure the switches in the variable resistance network. In some embodiments, the state machine 515 may need to select both the VRPS to configure the switches in the variable resistance network and the VDRPS to configure the switches in the differential resistance network to achieve a desired operating point, such as, for example, a predetermined differential gain level with a predetermined bias voltage at the bias node 355.

When a board level power supply (e.g., the $V_{DD}$) is selected, to achieve a predetermined differential gain level, the user may select a corresponding load specification to configure the variable resistance network and the differential resistance network of the DAC.

Figure 6:
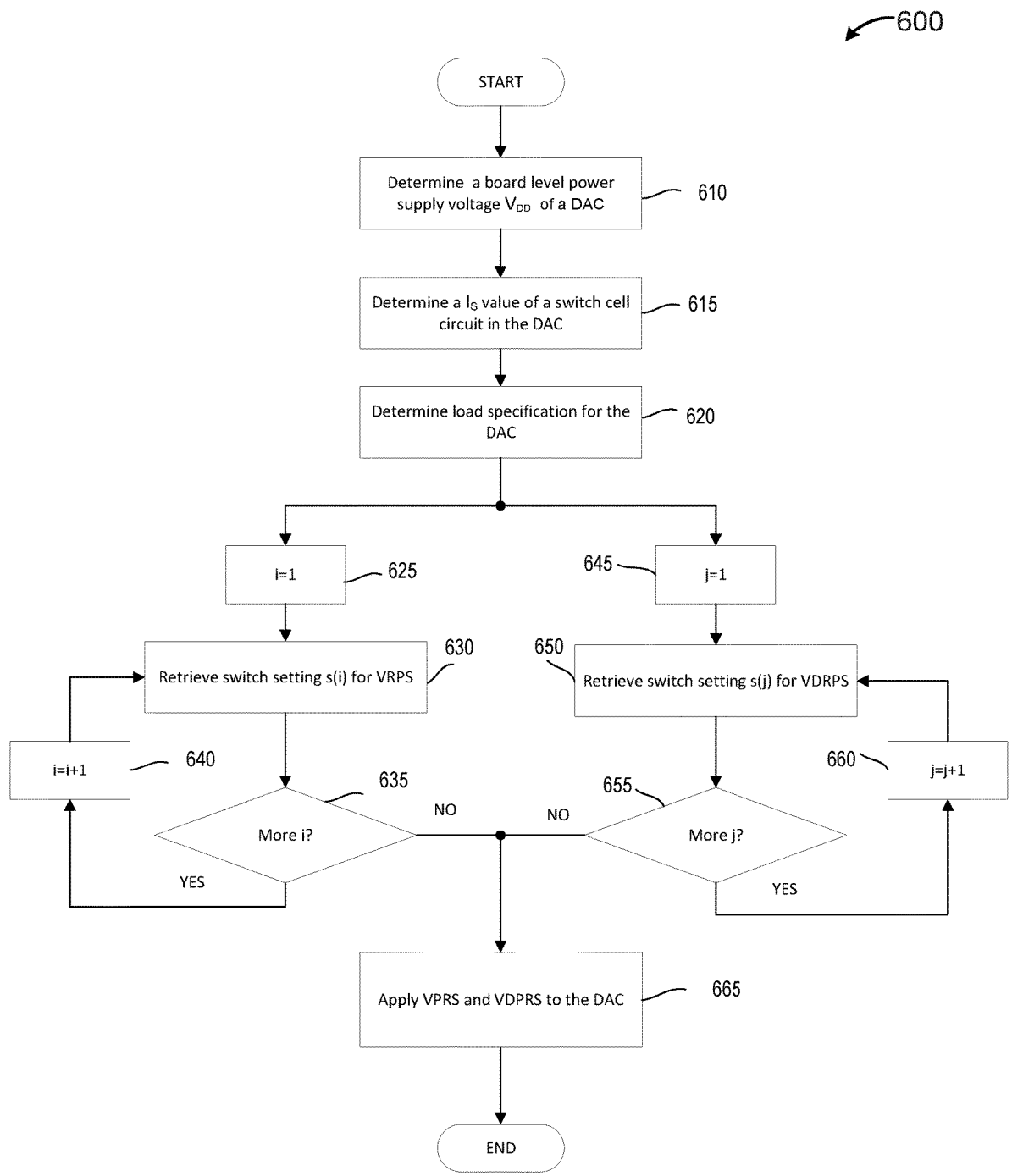
FIG. 6 depicts a flow chart of an exemplary method to configure the DAC.

FIG. 6 depicts a flow chart of an exemplary method to configure the DAC. A method 600 to configure the DAC 400 is discussed. Before run time, a first lookup table is formed to store load specifications for the variable resistance network 270 and a second lookup table is formed to store load specifications for the second differential resistance network.

At 610, a board-level power supply $V_{DD}$ fed to the DAC 400 is determined (e.g., $V_{DD}$=3 V). At 615, current value $I_S$ of a switching cell circuit in the DAC 400 is determined (e.g., $I_S$=20 mA). At 620, a corresponding load specification is selected for the DAC through the two lookup tables in response to the board-level power supply $V_{DD}$ and current $I_S$. At 625, the state machine 515 in the control circuit 275 initializes a first variable i to 1. At 630, the state machine 515 retrieves switch setting S(i) for a first switch (e.g., the switch 375) in the variable resistance network (e.g., the variable resistance network 270). At 635, if the variable resistance network includes more switches, then the state machine 515 increments the variable i and loops back to 630. If, at 635, no more switches is in the variable resistance network, at 665, the switch settings of the variable resistance network are applied to the DAC.

At 645, initialize a second variable j to 1. At 650, retrieve switch setting S(j) for a first switch in the differential resistance network (e.g., the second differential resistance network 405). At 655, if the differential resistance network includes more switches, then the variable j is incremented and loops back to 650. If, at 655, no more switches are in the variable resistance network, at 665, the switch settings of the differential resistance network are applied to the DAC.

Although various embodiments have been described with reference to the figures, other embodiments are possible. For example, transistors used in the switch cell circuit may be bipolar junction transistors (BJTs). In some embodiments, transistors used in one switch cell may be BJTs and transistors used in another switch cell may be MOSFETs. In some embodiments, more capacitors may be used in the variable resistance network. In some embodiments, the second differential resistance network may also include one or more capacitors that connect with at least a portion of the resistances in parallel. In some embodiments, the variable resistance network and/or the second differential resistance network may be adjusted to achieve predetermined differential output impedance and gain. In some embodiments, the variable resistance network and/or the second differential resistance network of the DAC may be adjusted to make load matching to minimize signal reflection or maximize power transfer. In some embodiments, the DAC and/or the control circuit may be implemented in an ASIC.

Various examples of modules may be implemented using circuitry, including various electronic hardware. By way of example and not limitation, the hardware may include transistors, resistances, capacitors, switches, integrated circuits and/or other modules. In various examples, the modules may include analog and/or digital logic, discrete components, traces and/or memory circuits fabricated on a silicon substrate including various integrated circuits. In some embodiments, the module(s) may involve execution of preprogrammed instructions and/or software executed by a processor. For example, various modules may involve both hardware and software.

A number of implementations have been described. Nevertheless, it will be understood that various modification may be made. For example, advantageous results may be achieved if the steps of the disclosed techniques were performed in a different sequence, or if components of the disclosed systems were combined in a different manner, or if the components were supplemented with other components. Accordingly, other implementations are within the scope of the following claims.

What is claimed is:

1. A circuit comprising:
   a switch cell circuit comprising at least one switch cell, each of the at least one switch cells comprising a differential gain circuit having a first branch coupled to a second branch at an input of a current source, the first branch and the second branch configured to combine their respective currents to supply a current amplitude of $I_{DAC}$ to the current source in response to a differential control signal;
   a first differential resistance coupled to supply current from a bias node to the first branch of each of the at least one switch cells;
   a second differential resistance coupled to supply current from the bias node to the second branch of each of the at least one switch cells; and,
   a programmable resistance coupled between a voltage supply node $V_{DD}$ and the bias node, wherein the programmable resistance comprises a variable resistance configured to adjust a voltage ($V_{bias}$) at the bias node to one of a predetermined set of values in response to a variable resistance programming signal (VRPS).

2. The circuit of claim 1, further comprising a control circuit configured to generate the VRPS in response to automatically determined circuit parameters.

3. The circuit of claim 2, wherein the circuit parameters comprise the current amplitude of $I_{DAC}$.

4. The circuit of claim 2, wherein the circuit parameters further comprise a resistance value of the first differential resistance and a resistance value of the second differential resistance.

5. The circuit of claim 2, wherein the control circuit is further configured to generate the VRPS in response to a lookup table storing one or more predetermined settings for the VRPS.

6. The circuit of claim 1, further comprising a control circuit configured to generate the VRPS in response to predetermined gain specification for a digital-to-analog Converter (DAC).

7. The circuit of claim 1, further comprising a capacitance arranged in a parallel configuration with at least a portion of the programmable resistance.

8. The circuit of claim 1, wherein the programmable resistance comprises a network of resistive paths configured to be selectively controlled in response to the VRPS.

9. The circuit of claim 8, wherein the network of resistive paths comprises one or more p-channel FETs.

10. The circuit of claim 1, further comprising a first programmable differential resistance coupled in parallel with the first differential resistance, wherein the first programmable differential resistance comprises a first variable resistance configured to adjust a differential gain of the first branch to a first predetermined gain value in response to a first variable differential resistance programming signal (VDRPS).

11. The circuit of claim 10, further comprising a second programmable differential resistance coupled in parallel with the second differential resistance, wherein the second programmable differential resistance comprises a second variable resistance configured to adjust the differential gain of the second branch to a second predetermined gain value in response to a second variable differential resistance programming signal (VDRPS).

12. The circuit of claim 1, further comprising a plurality of the at least one switch cell connected in parallel.

13. The circuit of claim 12, wherein the plurality of the at least one switch cell connected in parallel comprises switch cells between 1 and 128.

14. A method comprising:
  combining, with a switch cell circuit, respective currents from a first branch and a second branch to supply a current amplitude $I_{DAC}$ to a current source in response to a differential control signal, wherein the switch cell circuit comprising at least one switch cell, each of the at least one switch cells comprising a differential gain circuit having the first branch coupled to the second branch at an input of the current source;
  supplying current from a bias node to the first branch of each of the at least one switch cells through a first differential resistance;
  supplying current from the bias node to the second branch of each of the at least one switch cells through a second differential resistance; and,
  adjusting a voltage ($V_{bias}$) at the bias node to one of a predetermined set of values in response to a variable resistance programming signal (VRPS) through a programmable resistance coupled between a voltage supply node $V_{DD}$ and the bias node,
  wherein the programmable resistance comprises a variable resistance configured to adjust the voltage $V_{bias}$ at the bias node.

15. The method of claim 14, further comprising generating the VRPS in response to automatically determined circuit parameters.

16. The method of claim 15, wherein the circuit parameters comprise the current amplitude of $I_{DAC}$.

17. The method of claim 16, wherein the circuit parameters further comprise a resistance value of the first differential resistance and a resistance value of the second differential resistance.

18. The method of claim 14, wherein the first differential resistance is programmable.

19. The method of claim 18, wherein the second differential resistance is programmable.

20. The method of claim 14, wherein the switch cell circuit further comprises a plurality of the at least one switch cell connected in parallel.

* * * * *